(12) United States Patent  
Seibert (10) Patent No.: US 8,913,641 B2  
(45) Date of Patent: Dec. 16, 2014

(54) METHOD FOR PRODUCING A LASER DEVICE

(75) Inventor: Claus Seibert, Regensburg (DE)

(73) Assignee: OSRAM GmbH, Munich (DE)

( * ) Notice: Subject to any disclaimer, the term of this patent is extended or adjusted under 35 U.S.C. 154(b) by 126 days.

(21) Appl. No.: 13/519,123

(22) PCT Filed: Nov. 23, 2010

(86) PCT No.: PCT/EP2010/068004  
§ 371 (c)(1),  
(2), (4) Date: Jun. 25, 2012

(87) PCT Pub. No.: WO2011/076506  
PCT Pub. Date: Jun. 30, 2011

(65) Prior Publication Data  
US 2012/0294326 A1    Nov. 22, 2012

(30) Foreign Application Priority Data  
Dec. 23, 2009   (DE) .................. 10 2009 055 225

(51) Int. Cl.  
*H01S 5/00*   (2006.01)  
*H01S 5/022*  (2006.01)  
*G02B 7/02*   (2006.01)  
*G02B 7/00*   (2006.01)

(52) U.S. Cl.  
CPC ............ *H01S 5/02288* (2013.01); *G02B 7/025* (2013.01); *G02B 7/003* (2013.01); *H01S 5/0014* (2013.01); *G02B 7/021* (2013.01)  
USPC ..................................... 372/50.23

(58) Field of Classification Search  
CPC ...... G02B 7/021; G02B 7/025; H01S 5/0014; H01S 5/02288  
USPC ................... 372/50.124, 50.23, 107; 359/642  
See application file for complete search history.

(56) References Cited

U.S. PATENT DOCUMENTS 5,033,052 A    7/1991  Masuko et al.  
5,351,264 A *  9/1994  Kato et al. .................. 372/107

(Continued)

FOREIGN PATENT DOCUMENTS

CN    101464552   6/2009  
DE    102 04 799   9/2003

(Continued)

*Primary Examiner* — Tuan Nguyen  
(74) *Attorney, Agent, or Firm* — Cozen O'Connor (57) ABSTRACT

A method for producing a laser device comprising: a semiconductor laser (1) which is configured to emit a laser beam; (2), and a lens (3) which is position-adjusted relative to the semiconductor laser (1), wherein the lens (3) is firstly shifted perpendicularly to the expansion direction of the laser beam (2) and is consequently penetrated by the laser beam (2), wherein the optical axis of the lens (3) lies parallel to the expansion direction of the laser beam (2), and the lens (3) is then fastened to a lens holder (5) by a joining connection (4) by flowing material, which solidifies in order to form the joining connection, such that the mobility of the lens (3) perpendicular to the expansion direction of the laser beam (2) is blocked.

13 Claims, 5 Drawing Sheets

(56) References Cited

U.S. PATENT DOCUMENTS

| | | |
|---|---|---|
| 5,758,950 A | 6/1998 | Naoe et al. |
| 7,308,012 B2 | 12/2007 | Namiwaka et al. |
| 2002/0075916 A1 | 6/2002 | Sato et al. |
| 2004/0264538 A1 | 12/2004 | Namiwaka et al. |
| 2006/0119805 A1 | 6/2006 | Wittenberg et al. |
| 2006/0222042 A1 | 10/2006 | Teramura et al. |
| 2008/0050151 A1* | 2/2008 | Kato et al. .................... 399/221 |

FOREIGN PATENT DOCUMENTS

| | | |
|---|---|---|
| EP | 1 879 061 | 1/2008 |
| EP | 2 073 047 | 6/2009 |
| JP | 2009-156958 | 7/2009 |
| WO | WO 2005 008578 | 1/2005 |
| WO | WO 2010/047147 | 4/2010 |

* cited by examiner

METHOD FOR PRODUCING A LASER DEVICE

RELATED APPLICATIONS

This is a U.S. National Phase Application under 35 USC 371 of International Application PCT/EP2010/068004 filed on Nov. 23, 2010.

This application claims the priority of German Application No. 10 2009 055 225.1 filed Dec. 23, 2009, the entire content of which is hereby incorporated by reference.

FIELD OF THE INVENTION

1. Technical Field

The present invention relates to a method for producing a laser device having a semiconductor laser designed for emitting a laser beam and a lens which is position-adjusted relative to the semiconductor. The invention also relates to an inventively produced laser device and to the use thereof for projection applications.

2. Background of the Invention

In a semiconductor laser light is generated by recombination processes of electrons and holes at the transition between a p-doped region and an n-doped region, it being possible to determine the emitted wavelength by the choice of semiconductor material, and this is typically in a range from near infrared through to ultraviolet.

In the laser devices known from the prior art the semiconductor laser is assembled in a metal housing and a lens is provided in the housing for focusing the laser beam. On the inside the lens rests on a through-opening in the housing cover and is held in this position by force fit.

SUMMARY OF THE INVENTION

One object of the invention is to provide a method for producing a laser device having a lens which is position-adjusted relative to a semiconductor lens.

According to one aspect of the invention this object is achieved in that the lens is firstly shifted perpendicularly to the expansion direction of the laser beam and is consequently penetrated by the laser beam, wherein the optical axis of the lens lies parallel to the expansion direction of the laser beam, and the lens is then fastened to a lens holder by a joining connection by means of flowing material, which solidifies in order to form the joining connection, such that the mobility of the lens perpendicular to the expansion direction of the laser beam is blocked.

The lens is therefore oriented such that the optical axis lies parallel to the expansion direction of the laser beam. The parallelism is also still regarded as given within an angular range of up to 15° on either side, preferably with a deviation of up to 5°, particularly preferably of up to 2°. The laser beam can also run convergently or divergently, so the expansion direction can be a mean of a large number of directions.

The lens oriented parallel to the expansion direction of the laser beam by the optical axis is then moved perpendicular to the expansion direction of the laser beam and is consequently penetrated by the laser beam. The term "perpendicular" is also understood within the context of the angle tolerance just mentioned. The lens can optionally also be moved along the optical axis before, during or after the movement perpendicular to the optical axis. On the one hand the lens holder can be moved together with the lens with a relative position fixed with respect thereto, it being possible for this to also take place only in the expansion direction or perpendicular thereto. On the other hand the lens holder can also be moved independently of the lens, so, by way of example, firstly the lens is moved into the end position and then the lens holder can be positioned, or the lens holder can firstly be moved in the expansion direction and then the lens can be moved transversely thereto along the lens holder.

Following movement perpendicular to the expansion direction the lens is then fastened to the lens holder by a joining connection in such a way that the mobility of the lens is blocked. In this connection the term "mobility" describes the fact that the position of the lens can be changed relative to the semiconductor laser, by way of example in that the lens is held by a guiding tool of a guiding device and is moved therewith relative to the semiconductor laser. Mobility also exists in particular if the lens is currently not being moved and, because it is held in a holding tool, can also only be moved by the moving device. Mobility can then be permanently blocked by a joining connection by means of flowing material, then solidifies, i.e. by way of example welding, soldering or gluing, between lens and lens holder.

A joining connection within the scope of the invention therefore permanently fixes two components in position relative to each other by means of flowing material between or on the components, which solidifies in order to from the joining connection. The material is initially in a flowing, liquid state, i.e. with a certain viscosity, and can preferably also be applied in this state. The material then passes from the liquid state into a solidified state due by way of example to contact with air or another gas or due to the addition of a chemical reaction partner, another interaction, by way of example with light, or due to cooling. In this state the material is resistant to deformation, i.e. substantially retains its shape, but can optionally still react elastically or viscoplastically to a mechanical stress. The connection is permanent in the sense that the components can only be moved relative to each other again, once the joining connection is undone, due to a mechanical effect, in particular the use of force, heating or chemical treatment.

As, according to an embodiment of the invention, the lens is firstly moved perpendicular to the expansion direction and is only then fixed in position, the lens can be positioned with a high degree of precision relative to the semiconductor laser and so as to be individually adjusted thereto. Variations in the position of the semiconductor laser resulting from assembly by way of example can therefore be compensated by the lens position.

A detailed distinction will no longer be made below between the description of the method for producing a laser device and the device and use aspects of the invention; the disclosure should be implicitly understood in relation to all categories.

A first embodiment of the invention provides that the lens is moved in the expansion direction but not once the mobility of the lens perpendicular to the expansion direction is blocked. The lens holder is preferably movably mounted in the expansion direction of the laser beam in this connection, wherein the position of the lens in this direction is also preferably fixed by a bearing surface between the lens and the lens holder, particularly preferably a planar bearing surface.

The moveable mounting in the expansion direction preferably allows a large number of relative positions between the lens holder (and therefore the contact surface for the lens) and the semiconductor laser, particularly preferably by way of a linear movement. A moveable mounting would also be provided by a screwed joint by way of example, however, whose axis of rotation is oriented in the expansion direction.

The relative position between the contact surface for the lens and the semiconductor laser can be adjusted with control by way of a distance measurement, by way of example optically, mechanically or electrically. An adjustment of the relative position between the contact surface and the semiconductor laser is preferably as a function of the laser beam following passage through the lens, and in particular as a function of the diameter therefore, however.

It is crucial that the position of the lens is already fixed in the direction of expansion of the laser beam (even if not necessarily blocked yet) if the mobility of the lens perpendicular to the expansion direction is blocked.

In a further development it is provided that the mobility of the lens perpendicular to the expansion direction is blocked at the same time as mobility in the expansion direction. For this purpose on the one hand the mobility of the lens holder in the expansion direction can already be blocked, so the joining connection between lens holder and lens blocks the mobility thereof perpendicular to the expansion direction and in this direction. The lens can be position-adjusted twice for this purpose by way of example, so following the first position adjustment, and as a function thereof, the mobility of the lens holder is blocked, and following the second position adjustment the joining connection between lens holder and lens is produced.

On the other hand the joining connection between lens and lens holder can also be created at the same time as blocking of the mobility of the holder in the expansion direction. The lens is preferably firstly moved in such a way that predefined desired values are attained for deflection and diameter of the laser beam, the lens is therefore brought into the final adjusted position. The lens holder can consequently be moved at the same time as or even synchronously with the lens or even independently thereof. Once the lens has been brought into the adjusted position the mobility of the lens and lens holder is blocked simultaneously.

In a further embodiment it is provided that during movement perpendicular to the expansion direction the lens is guided along a planar bearing surface on an end face of the lens holder, with the lens being otherwise free. It is therefore connected to the lens holder at most by a guiding device used for assembly and which is removed once the mobility along the planar bearing surface is blocked. The lens holder therefore preferably includes a planar bearing surface oriented perpendicular to the expansion direction and on which by way of example the planar side of a plano-concave or plano-convex lens finds a planar bearing surface. If the lens is now moved toward the expansion direction the position of the lens in the expansion direction does not change as a result of the planar bearing surface.

The lens does not necessarily have to touch the lens holder. It is therefore also possible for the guiding tool to touch the lens holder or for neither guiding tool nor lens to touch the lens holder and to only be moved toward this at a substantially constant spacing. It is crucial that the lens position can be adjusted perpendicular to the expansion direction, by way of example as a function of the deflection of the laser beam, without the diameter of the laser beam being changed in the process. In addition to a lens with a plane side surface, a lens with an encircling projection which rises perpendicular to the optical axis may also be provided by way of example, with the side of the projection facing the semiconductor laser finding a planar bearing surface on the lens holder.

Even though the lens lies flat on the lens holder during assembly and optionally even touches this, it is, however, only connected to the lens holder by the guiding device used for assembly and which is removed thereafter. The term "connected" therefore designates a physical connection sufficient for guiding purposes but which can also be undone again without the use of force, i.e. is in particular not a joining connection. Lens holder and lens are therefore held by way of example by guiding tools of the guiding device by way of a clamping, screwing or vacuum mechanism if the lens if moved along the planar bearing surface of the lens holder.

In a further embodiment it is provided that following a movement of the lens perpendicular to and in the direction of expansion of the laser beam, the lens holder is guided to the lens which is free thereof (and consequently is therefore at most connected thereto by a guiding device used for assembly and which is removed once the joining connection between lens holder and lens is produced). The lens is therefore moved by way of example by a guiding tool of the guiding device in to the position adjusted relative to the semiconductor laser. The lens holder, which can also be held by a guiding tool of the guiding device, is only advanced to the lens if this is in the adjusted position and will no longer be moved. The lens, the lens holder and the semiconductor laser together with a possible assembly device are therefore preferably connected to each other solely by the guiding device during the adjustment in that they are held in the guiding tools thereof.

Movement of the lens is particularly easily possible if the lens holder is not moved as well, because in this case only a guiding tool has to be moved during the adjustment. The lens holder is only advanced to the lens following positioning, it being possible for this to then take place by way of example with coordination between the two guiding tools, optionally also with distance-dependent speed adjustment.

As the lens and the lens holder preferably have a plane contact surface in one region (of the relative movement to each other which is to be typically expected), no further adjustment is necessary apart from the movement of the lens holder in the expansion direction toward the lens. A joining connection between the lens holder and a guiding device or an assembly device of the semiconductor laser, such as a housing, blocks the mobility of the lens holder in the expansion direction and a second joining connection between the lens and the lens holder blocks the mobility of the lens perpendicular to the expansion direction (and also in the expansion direction). The lens is fixed in position relative to the semiconductor laser by the two joining connections.

In a further embodiment it is provided that the lens and the lens holder are held on the guiding tools of the guiding device by vacuum. The lens holder and the lens can on the one hand thus be securely held and guided during positioning as long as mobility is not yet blocked. On the other hand, the lens holder and the lens can then be released again simply by removing the vacuum, without undoing a connection, so interference with the adjusted position can be avoided.

The guiding tools and the lens or the lens holder can be adapted to each other, so, by way of example, the guiding tools can have suction openings adapted to a dome of the corresponding outer surface of lens holder or lens. On the other hand plane faces may also be provided on the lens or the lens holder, on which a correspondingly plane suction opening of the guiding tool finds a planar bearing surface.

In a further embodiment it is provided that the semiconductor laser is mounted in a housing and the mobility of the lens in the expansion direction is blocked by a joining connection between housing and lens holder. In a plane perpendicular to the expansion direction the housing can have by way of example a round or even a rectangular cross-section.

In a further development it is provided that the lens holder is a tubular body with a through-opening such that the lens holder can be pushed onto the housing before movement of the lens and is pushed onto the housing before movement. Viewed in the expansion direction and as a function of the housing the through-opening can have a substantially circular or even rectangular cross-section and is preferably designed such that the inner wall of the tubular body has a flat bearing surface on an opposing outer side of the housing when moved in the expansion direction. Within the framework of freedom of movement required for the movement in the expansion direction the planar bearing surface blocks the mobility of the lens holder perpendicular to the expansion direction. With this preferred embodiment the lens holder is therefore (substantially) mobile in the expansion direction (a rotational movement, which does not change the spacing of the focal points, is not a movement in this sense).

In a further embodiment a second lens is moved in the expansion direction and perpendicular thereto and thereafter fastened to a second lens holder by a joining connection by means of the application of flowing material, which solidifies in order to form the joining connection. The second lens holder and the second lens can be moved in the manner described above and can be blocked mobility-wise by the joining connection. The mobility of the second lens holder can be blocked by a joining connection to the first lens holder or to an assembly device of the semiconductor laser, by way of example a housing. As two lenses are provided a laser beam with a, viewed in the expansion direction, elliptical cross-sectional profile can be changed by way of example by a cylindrical lens such that a substantially circular cross-sectional profile results. An elliptical cross-sectional profile is produced by way of example by a waveguide geometry in the semiconductor laser itself with a rectangular, in particular non-square, profile. Deflection and diameter of the (now circular) laser beam can then be changed by a second, viewed in the expansion direction, rotationally symmetrical lens in the manner described above.

In a further embodiment the laser beam is directed during the movement of the lens onto an optical sensor. The laser beam can fall directly from the lens onto the sensor or be directed onto it by a further optical system. The sensor can be constructed from a diode by way of example, it being possible for the deflection of the laser beam to be measured in one direction by way of subtraction using an arrangement of two diodes. The deflection of the laser beam can analogously be determined in a plane, or its diameter can be determined, using four diodes or one diode with four quadrants (four-quadrant diode). This is also possible using a CCD sensor (charged-coupled device) which is made from a matrix of light-sensitive elements.

An optical sensor can therefore provide electrical signals independently of deflection or diameter of the laser beam, and these are then supplied by way of example to an automated control or regulating unit or may be displayed so they can be visually read by a worker. The electrical signals, which can optionally also be converted into electronic signals, are therefore preferably used as controlled variables during movement of the lens.

In a further embodiment the joining connection is produced by an adhesive. In the case of a glued joint between by way of example the lens holder and the lens, there exists a fixed (even if not inseparable) connection between the lens holder and lens on the one hand owing to the adhesion of the adhesive to the lens holder and lens and on the other hand owing to the internal strength of the adhesive.

Adhesives containing solvent, dispersion adhesives or even chemically curing adhesives by way of example may be used as adhesives. In addition to plastics material the adhesive can also contain components such as metal or glass and be optimized moreover in its composition to the extent that shrinkage during curing is minimized.

The adhesive is preferably physically arranged in such a way that the forces exerted on the respective components in the case of shrinkage of adhesive substantially cancel each other out (this also applies generally to the joining connections). In the case of a lens which is round viewed in the expansion direction, adhesive can therefore be present by way of example over its entire circumference or equidistant adhesive dots may be provided along the circumference.

The adhesive can in particular be a UV-curing adhesive. The UV-curing adhesive, based by way of example on acrylate, can firstly be pre-cured. The guiding tools can preferably be taken from the lens and lens holder as early as following pre-curing, so the guiding device is then already available again for adjustment of the next laser device. The pre-cured components can then be completely cured, and this can take place at a different wavelength or lamp wattage.

In a further embodiment the lens holder is made from a UV-permeable material and the glued joint between housing and lens holder is cured by irradiation with UV light. For the lens holder, which, in contrast to the material of the joining connection, is in a state resistant to deformation even before movement of the lens, a UV-permeable plastics material or silica glass is therefore preferably provided. Shadow formation due to the lens holder can therefore be reduced in the case of the UV irradiation. The adhesive can be pre-cured or completely cured preferably with irradiation from a single direction as a function of the geometry of the housing and the lens holder. The glued joints between housing and lens holder and between this and the lens are particularly preferably pre-cured or completely cured at the same time.

In a further embodiment the flowing material is introduced onto the housing by way of an additional opening in the lens holder. A joining connection between housing and lens holder can also be achieved thereby if, by way of example, the outer surface of the lens holder opposing the contact surface for the lens is difficult to access for application of the flowing material. The additional opening extends transversely to the through-opening but not necessarily at an angle of 90° but at any angle between 0° and 180°.

Another aspect of the invention is directed to a laser device having a semiconductor laser, a lens and a lens holder, wherein the lens is position-adjusted relative to the semiconductor laser in a method as claimed in any one of the preceding claims and is fastened to the lens holder with a joining connection by means of a previously flowing material, which is solidified.

Such a laser device can be used in a laser RGB module. A module of this kind can be used by way of example as a component of a projection apparatus, in particular a portable projection apparatus. The highest requirements of the resolution, by way of example Video Graphics Array (VGA) or Extended Video Graphics Array (EVGA) are also possible in this connection. The three primary colors: red, green and blue, are each generated by means of a laser beam source and superimposed by a corresponding optical system in such a way that a single beam or spot is produced. So the correspondingly high resolutions can be achieved in this connection the offset of the beams is not allowed to exceed, with increasing preference in this sequence: 100 micrometers, 75 micrometers, 50 micrometers and 25 micrometers. A laser device produced according to the invention having a lens position-adjusted relative to the semiconductor laser, which lens adjusts both the deflection and the diameter of the laser beam, is therefore particularly suitable by way of example for such an application.

BRIEF DESCRIPTION OF THE DRAWINGS

The invention will be described in more detail below with reference to exemplary embodiments, it being possible for the individual features to be essential to the invention in other combinations as well and to implicitly refer to all categories of the invention.

DETAILED DESCRIPTION OF THE DRAWINGS

Figure 1:
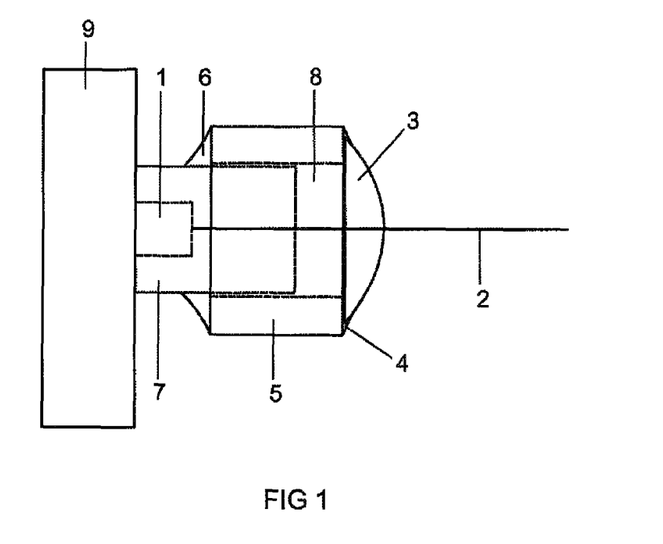
FIG. 1 shows a lens secured to a lens holder by a glued joint.

FIG. 1 shows a laser device having a semiconductor laser 1 which emits a laser beam 2. The laser beam 2 is focused by a lens 3 which is secured to a lens holder 5 by a joining connection 4. The lens holder 5 is fastened to a housing 7 of the semiconductor laser by a further joining connection 6 and is thus fixed in position relative to the semiconductor laser 1 as well.

The lens holder 5 has a through-opening 8 into which the housing 7 is pushed slightly, it having been possible to move the lens holder up to a bearing surface on a mounting base 9 on the housing 7 before application of the joining connection. The lens holder is fixed in position in relation to directions perpendicular to the expansion direction of the laser beam 2 due to a bearing surface of the recess 8 on an outer surface of the housing 7. Following adjustment of the lens position in the expansion direction of the laser beam 2 and perpendicular thereto, the lens holder 5 previously pushed onto the housing 7 can be advanced to the lens 3. As the lens 3 finds a planar bearing surface on the lens holder 5 the movement of the lens holder 5 in the expansion direction of the laser beam 2 can occur independently of the position of the lens 3 in directions perpendicular to the expansion direction of the laser beam 2. Once the lens holder 5 has been advanced to the position-adjusted lens 3 a joining connection 4 is produced between lens holder 5 and lens 3 and between lens holder 5 and housing 7 using UV-curing adhesive. Since the lens holder 5 is made from a UV-permeable material the joining connection between lens holder and housing can be cured by irradiation with UV light from a direction opposed to the expansion direction of the laser beam 2.

Figure 2:
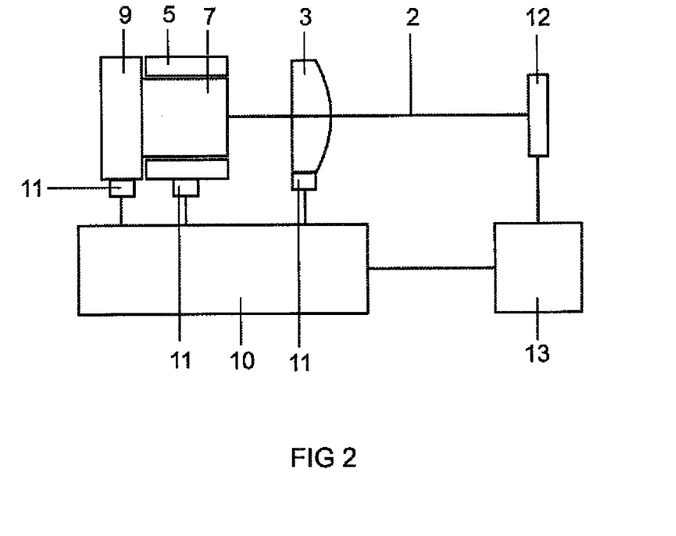
FIG. 2 shows a movement of the lens as a function of the deflection of the laser beam.

FIG. 2 shows a guiding device 10 having three guiding tools 11 in which the semiconductor laser 1 with a housing 7, lens holder 5 and lens 3 are held, the last two being held on the guiding tools 11 by vacuum. The laser beam 2 passes through the lens 3 and then strikes a sensor 12 with which deflection and diameter of the laser beam 2 are measured. The sensor 12 passes corresponding electrical signals to an evaluation unit 13 which regulates the positioning of the lens 3 by way of the guiding device 10.

Figure 3:
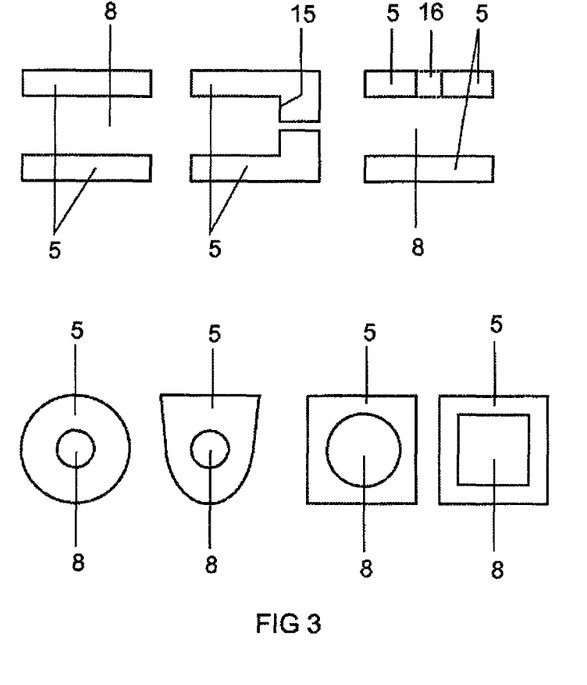
FIG. 3 shows cross-sectional profiles of various lens holders.

FIG. 3 shows cross-sections through various lens holders 5, wherein the cross-sectional planes contain both the expansion direction of the laser beam 2 (top row) and are also oriented perpendicular to this direction (bottom row). The lens holder 5 can have a linear, continuous through-opening 8 or a through-opening 8 which tapers in such a way that a stop 15 is produced. Such a stop 15 can then rest on the housing 7 before the joining connection 6 is provided between lens holder 5 and housing 7. An additional through-opening 16 extending transversely to the expansion direction to the through-opening 8 is also provided in the top right cross-sectional form. Adhesive can then also be introduced between housing 7 and lens holder 5 through this opening 16 if the side surface of the lens holder 5 opposing the contact surface for the lens 3 is difficult to access.

The lens holder 5 can have a round outer surface to which a vacuum tool 11 is then adapted accordingly, or it may also have a flattened outer surface or a form having generally flat outer sides, so a guiding tool 11 generating a vacuum lies flat. The recess 8 can be adapted to the housing geometry, i.e. be round, in particular circular, or rectangular, in particular square.

Figure 4:
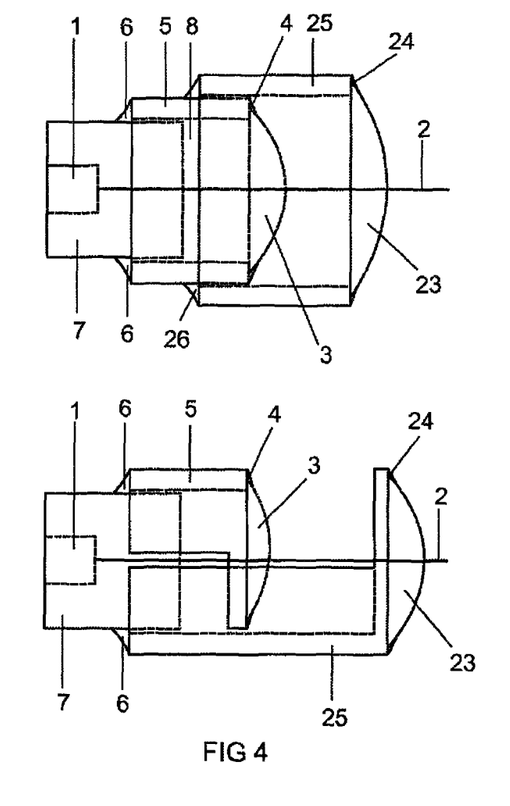
FIG. 4 shows laser devices having two lens holders.

FIG. 4 shows laser devices produced according to the invention each having two lens holders and two lenses. In the top diagram the second lens holder 25 is fastened by a joining connection 26 to the first lens holder 5 which is fastened to a joining connection 6 on the housing 7 of the semiconductor laser 1. The diameter of the first lens 3 is smaller than the external diameter of the first lens holder 5 in such a way that, within the framework of positioning conventional during adjustment, the joining connection 4 does not project above the lens holder 5 perpendicular to the expansion direction. The second lens holder 25 can therefore also be moved in the expansion direction following assembly of the first lens 3 by way of a planar bearing surface on the outer side of the first lens holder 5.

The bottom diagram shows two lens holders which are designed as mutually complementary halves. The first lens holder 5 does not rest completely around the housing 7 and the second lens holder 25 is likewise secured to the housing 7 by a joining connection 6. A laser device having two lens holders can thus be designed so as to be particularly compact with regard to directions perpendicular to the expansion direction, so two laser devices can be located in a module with a smaller spacing from each other.

Figure 5:
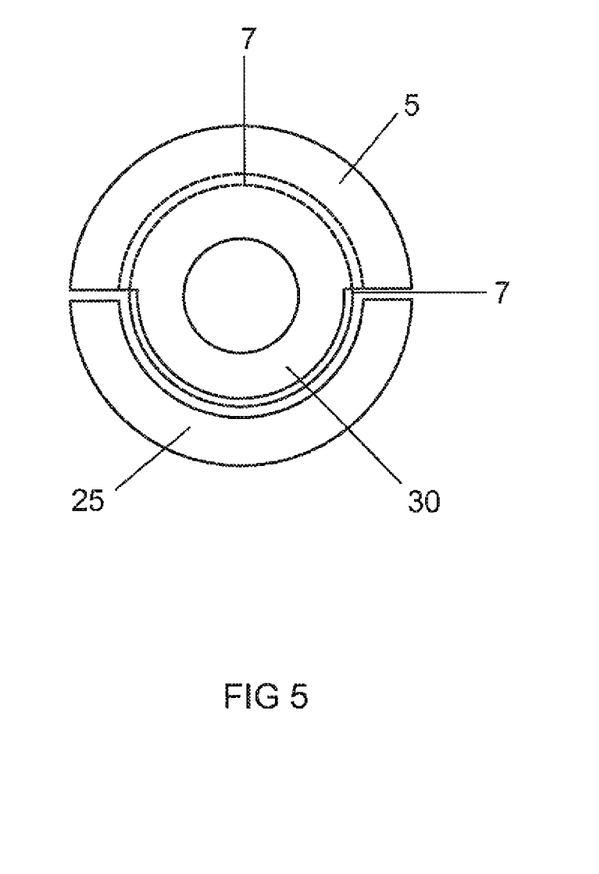
FIG. 5 shows a detail from FIG. 4.

Viewed in the expansion direction FIG. 5 shows a planar bearing surface 30 of the first lens holder 5 from the bottom diagram in FIG. 4. The first lens 3 can be moved along the planar bearing surface 30 perpendicular to the expansion direction and have its mobility blocked by an encircling joining connection 4 (not shown). Since the planar bearing surface 30 only partially projects above the housing 7 in directions perpendicular to the expansion direction the second lens holder 25 can move past the planar bearing surface 30 in such a way that the second lens holder can be moved in the expansion direction until mobility is blocked by a joining connection 6 to the housing 7.

The invention claimed is:

1. A method for producing a laser device comprising:
   a semiconductor laser configured to emit a laser beam; and
   a lens position-adjusted relative to the semiconductor laser,
   wherein the lens is firstly shifted perpendicularly to the expansion direction of the laser beam and is consequently penetrated by the laser beam,
   wherein the optical axis of the lens lies parallel to the expansion direction of the laser beam, and the lens is then fastened to a lens holder by a joining connection by flowing material, which solidifies in order to form the joining connection, such that the mobility of the lens perpendicular to the expansion direction of the laser beam is blocked,
   wherein, following a movement of the lens perpendicular to and in the expansion direction, the lens holder is guided to the lens and is consequently connected thereto only by a guiding device used for assembly and which is removed once the joining connection is produced between the lens holder and the lens,
   wherein the semiconductor laser is mounted in a housing and the mobility of the lens in the expansion direction is blocked by a joining connection between housing and lens holder by flowing material, which solidifies to form the joining connection, and wherein the lens holder is a tubular body with a through-opening such that the lens holder can be pushed onto the housing and is pushed onto the housing before the lens is moved.

2. The method as claimed in claim 1, wherein the lens is moved in the expansion direction but not once the mobility of the lens perpendicular to the expansion direction is blocked.

3. The method as claimed in claim 2, wherein the mobility of the lens perpendicular to the expansion direction is blocked at the same time as the mobility in the expansion direction.

4. The method as claimed in claim 1, wherein during movement perpendicular to the expansion direction, the lens is guided along a planar bearing surface on an end face of the lens holder to which the lens is connected only by a guiding device used for assembly and which is removed once the mobility along the planar bearing surface is blocked.

5. The method as claimed in claim 1, wherein the lens and the lens holder are held by vacuum on guiding tools of a guiding device.

6. The method as claimed in claim 1, wherein a second lens is moved in the expansion direction and perpendicular thereto and is fastened to a second lens holder by a joining connection by means of flowing material, which solidifies in order to form the joining connection.

7. The method as claimed in claim 1, wherein the laser beam is directed onto an optical sensor during the movement of the lens.

8. The method as claimed in claim 1, wherein the joining connection is produced by an adhesive.

9. The method as claimed in claim 8, wherein said adhesive is a UV-curing adhesive.

10. The method as claimed in claim 1, wherein the joining connection is produced by an adhesive, and wherein the lens holder is made from a UV-permeable material and the joining connection between said housing and said lens holder is cured by irradiation with UV light.

11. The method as claimed in claim 1, wherein the joining connection is produced by an adhesive, and wherein the flowing material is introduced onto the housing by an additional opening in the lens holder.

12. A laser device having a semiconductor laser, a lens and a lens holder, wherein the lens is position-adjusted relative to the semiconductor laser in a method as claimed in claim 1 and is fastened to the lens holder by a joining connection by a previously flowing material, which is solidified.

13. A portable projection apparatus including a laser RGB module comprising a laser device as claimed in claim 12.

* * * * *